(12) United States Patent
Yanagita

(10) Patent No.: US 8,426,287 B2
(45) Date of Patent: Apr. 23, 2013

(54) METHOD OF MANUFACTURING SEMICONDUCTOR DEVICE, SOLID-STATE IMAGING DEVICE, AND SOLID-STATE IMAGING APPARATUS

(75) Inventor: Masashi Yanagita, Kumamoto (JP)

(73) Assignee: Sony Corporation (JP)

( * ) Notice: Subject to any disclaimer, the term of this patent is extended or adjusted under 35 U.S.C. 154(b) by 204 days.

(21) Appl. No.: 12/945,255

(22) Filed: Nov. 12, 2010

(65) Prior Publication Data

US 2011/0127592 A1 Jun. 2, 2011

(30) Foreign Application Priority Data

Nov. 30, 2009 (JP) ................................. 2009-271858

(51) Int. Cl.
*H01L 21/20* (2006.01)

(52) U.S. Cl.
USPC ........... 438/383; 438/197; 438/514; 438/700; 257/E21.027; 257/E21.042; 257/E21.053; 257/E21.058; 257/E21.189; 257/E21.231; 257/E21.248; 257/E21.325; 257/E21.371; 257/E21.435; 257/291; 257/292

(58) Field of Classification Search .................. 438/514, 438/700, 197, 383, 289, 141, 390, 391, 392, 438/70, 75; 257/E21.027, E21.042, E21.053, 257/E21.058, E21.189, E21.231, E21.248, 257/257/E21.325, E21.352, E21.371, E21.435, 257/291
See application file for complete search history.

(56) References Cited

U.S. PATENT DOCUMENTS

| | | | | |
|---|---|---|---|---|
| 7,898,623 | B2 * | 3/2011 | Kimura et al. | 349/129 |
| 8,154,678 | B2 * | 4/2012 | Kimura et al. | 349/48 |
| 2007/0236640 | A1 * | 10/2007 | Kimura | 349/141 |

FOREIGN PATENT DOCUMENTS

JP 2007-158031 6/2007

* cited by examiner

*Primary Examiner* — David Nhu
(74) *Attorney, Agent, or Firm* — Sheridan Ross P.C.

(57) ABSTRACT

A method of manufacturing a semiconductor device includes the steps of forming a gate electrode of a transistor on an insulator layer on a surface of a semiconductor substrate, forming an isolation region by performing ion implantation of an impurity of a first conductivity type into the semiconductor substrate, forming a lightly doped drain region by performing, after forming a mask pattern including an opening portion narrower than a width of the gate electrode on an upper layer of the gate electrode of the transistor, ion implantation of an impurity of a second conductivity type near the surface of the semiconductor substrate with the mask pattern as a mask, and forming a source region and a drain region of the transistor by performing ion implantation of an impurity of the second conductivity type into the semiconductor substrate after forming the gate electrode of the transistor.

5 Claims, 14 Drawing Sheets

FIG. 10A (A-A) (B-B)
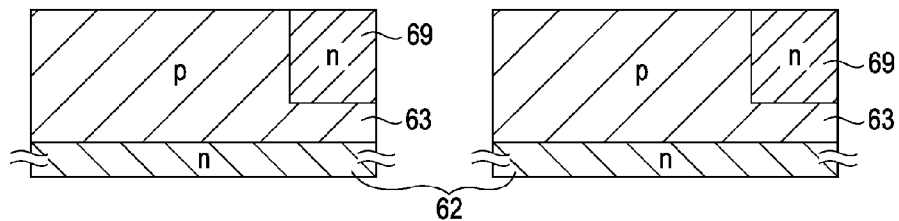
FIG. 10B
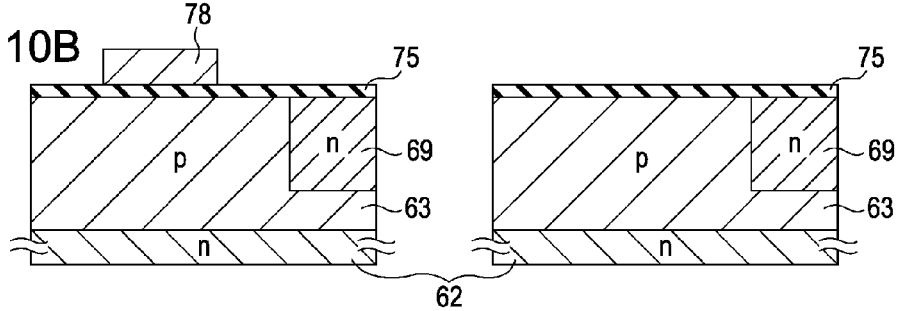
FIG. 10C
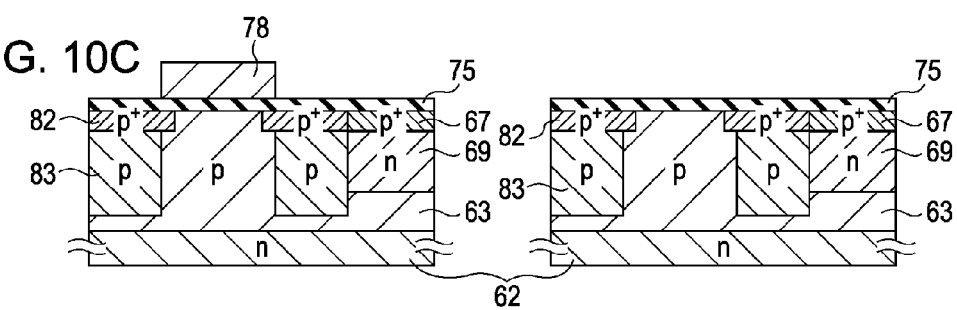
FIG. 10D
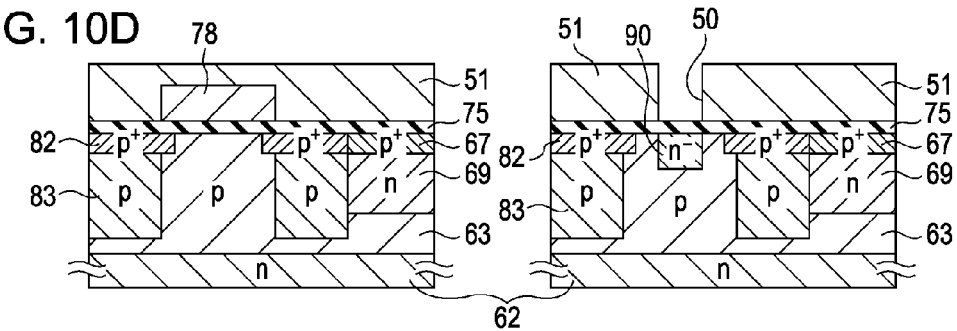

Related Art FIG. 14A
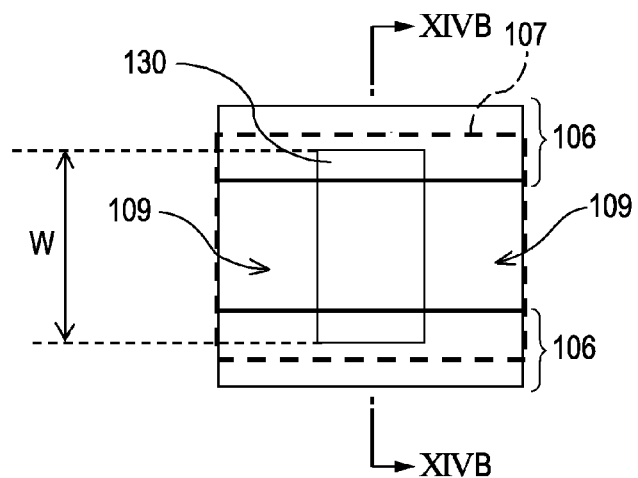
Related Art FIG. 14B
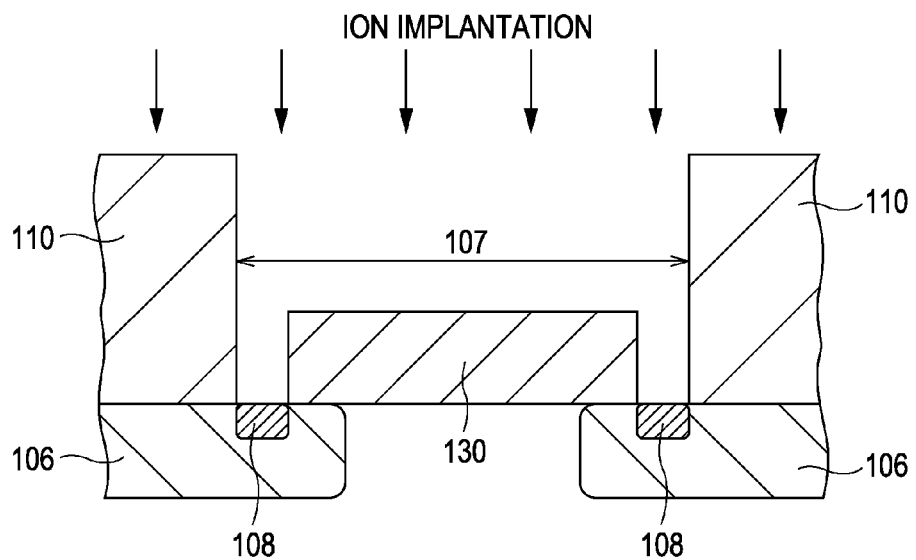

US 8,426,287 B2

METHOD OF MANUFACTURING SEMICONDUCTOR DEVICE, SOLID-STATE IMAGING DEVICE, AND SOLID-STATE IMAGING APPARATUS

RELATED APPLICATION DATA

The present application claims priority to Japanese Patent Application JP 2009-271858 filed in the Japan Patent Office on Nov. 30, 2009, which is incorporated herein by reference in its entirety to the extent permitted by law.

BACKGROUND OF THE INVENTION

1. Field of the Invention

The present invention relates to a method of manufacturing a semiconductor device, a semiconductor device, a solid-state imaging device, and a solid-state imaging apparatus. Specifically, the present invention relates to a method of manufacturing a semiconductor device and a semiconductor device in which isolation of a transistor is performed with a diffusion layer and to a solid-state imaging device and a solid-state imaging apparatus in which isolation of a transistor is performed with a diffusion layer.

2. Description of the Related Art

Generally, in MOS semiconductor devices, local oxidation of silicon (LOCOS) has long been used for isolation. However, in recent years, a shallow trench isolation (STI) method has been used for isolation in order to increase density.

It has become increasingly common to employ STI for isolation also in a solid-state imaging device such as a CMOS sensor.

FIG. 13 is a schematic view for illustrating the sectional structure of a main portion of a solid-state imaging device in which the STI method is used for isolation.

In a solid-state imaging device 101 shown herein, a p-type semiconductor well region 103 is formed on an n-type silicon substrate 102. A trench 104 is formed in the p-type semiconductor well region 103, and a silicon dioxide layer 105 is buried in the trench 104. With such a configuration, an isolation region, i.e., an STI region 106, is obtained for isolation within a pixel and between adjacent pixels.

The STI region 106 isolates adjacent pixels 110A and 110B, and isolates photodiodes PD, multiple transistors, and the like in the respective pixels 110A and 110B from one another.

It is noted that forming a lightly doped drain region in a source region or a drain region can improve transistor characteristic regarding noise or the like.

In the past, it has been generally considered that the transistor characteristic is not improved unless a lightly doped drain region is formed throughout all of the source region and the drain region. Thus, in order to reliably form a lightly doped drain throughout all of the source region and the drain region with consideration to a manufacturing error and the like, ion implantation has been performed using a mask including an opening portion 107 having a wider width than a gate electrode 130, as shown in FIGS. 14A and 14B. Therefore, a lightly doped drain region 108 has been formed also in the STI region 106 located on the outside of the gate electrode 130 in the width direction.

Note that a width of a gate electrode refers to the length of the gate electrode in the width direction of a current path of a transistor, and is the length shown by a reference symbol W in FIG. 14A. FIG. 14A shows a plan view of the transistor, and FIG. 14B shows a sectional view along line XIVB-XIVB in FIG. 14A. Further, in FIGS. 14A and 14B, reference numeral 109 denotes the source/drain region and reference numeral 110 denotes a resist that functions as a mask material.

The STI method described above is advantageous in that a fine isolation region is formed since the deep trench 104 is formed in the silicon substrate and the isolation region 106 is formed by burying the silicon dioxide layer 105.

However, due to the difference in coefficient of thermal expansion or the like between the deeply buried silicon dioxide layer 105 and the silicon substrate, there is a problem that a crystal defect due to thermal stress easily occurs.

Although efforts have been made by applying a taper shape or the like in STI, applying the taper shape narrows the area for the photodiode PD, leading to a decrease in saturation signal amount or sensitivity.

Also, in the STI method described above, a $p^+$ region 100 is formed (see FIG. 13) at the boundary between the silicon dioxide layer 105 in the trench 104 and the photodiode PD in order to prevent dark current or a white defect. However, thermal diffusion causes the $p^+$ region 100 to expand toward the photodiode PD side to narrow the area for the photodiode PD, leading to a decrease in saturation signal amount or sensitivity.

Thus, in order to increase the saturation signal amount by reducing the width of the isolation region and increasing the photodiode area, isolation using a diffusion layer implanted with an impurity has been performed (for example, see Japanese Unexamined Patent Application Publication No. 2007-158031).

SUMMARY OF THE INVENTION

In the case of the STI method, performing ion implantation of an impurity to form a lightly doped drain region in an isolation region does not pose a problem in particular.

However, in the case of the isolation using a diffusion layer, forming a lightly doped drain region in an isolation region outside the width of a gate electrode of a transistor causes the lightly doped drain region to act as a path for leakage current. The current path poses a risk of causing a short circuit of the transistor or a decrease in threshold voltage of the transistor.

It is desirable to provide a method of manufacturing a semiconductor device, a semiconductor device, a solid-state imaging device, and a solid-state imaging apparatus in which a short circuit of a transistor as well as a decrease in threshold voltage of a transistor can be prevented.

As a result of various research, the inventor of the present application has concluded that the transistor characteristic regarding noise or the like can be improved sufficiently even when a lightly doped drain region is not formed throughout all of the source region and the drain region.

In the past, it has been a common practice in the technical field to form a lightly doped drain region throughout all of the source region and the drain region in order to improve the transistor characteristic. However, by forming a sample of a transistor in which a lightly doped drain region is formed in a different region and repeatedly checking the transistor characteristic, it has been found that the common practice in the technical field of the past may not be entirely reasonable. As a result of further research, the inventor of the present application has concluded that the transistor characteristic regarding noise or the like can be improved sufficiently even when a lightly doped drain region is not formed throughout all of the source region and the drain region, as described above.

Based on this conclusion, a method of manufacturing a semiconductor device according to an embodiment of the present invention includes the steps of forming a gate electrode of a transistor on an insulator layer on a surface of a semiconductor substrate, forming an isolation region by performing ion implantation of an impurity of a first conductivity type into the semiconductor substrate, forming a lightly doped drain region by performing, after forming a mask pattern including an opening portion narrower than a width of the gate electrode on an upper layer of the gate electrode of the transistor, ion implantation of an impurity of a second conductivity type near the surface of the semiconductor substrate with the mask pattern as a mask, and forming a source region and a drain region of the transistor by performing ion implantation of an impurity of the second conductivity type into the semiconductor substrate after forming the gate electrode of the transistor.

By forming the mask pattern including the opening portion narrower than the width of the gate electrode of the transistor as the mask for forming the lightly doped drain region, ion implantation of the impurity of the second conductivity type on the outside of the gate electrode of the transistor in the width direction can be reduced and formation of a leakage current path can be prevented.

Note that the width of the gate electrode refers to the length of the gate electrode in the width direction of a current path of the transistor.

Also, according to an embodiment of the present invention, a semiconductor device includes an isolation region which is an impurity region of a first conductivity type, a source region and a drain region of a transistor which are impurity regions of a second conductivity type, a gate electrode of the transistor which is provided on an insulator layer on a surface of a semiconductor substrate formed with the isolation region and the source region and the drain region of the transistor, and a lightly doped drain region of the second conductivity type which is provided near the surface of the semiconductor substrate in a region narrower than a width of the gate electrode of the transistor.

Further, according to an embodiment of the present invention, a solid-state imaging device includes a photoelectric conversion unit configured to store a signal charge according to incident light, and a semiconductor device including an isolation region which is an impurity region of a first conductivity type, a source region and a drain region of a transistor which are impurity regions of a second conductivity type, a gate electrode of the transistor which is provided on an insulator layer on a surface of a semiconductor substrate formed with the isolation region and the source region and the drain region of the transistor, and a lightly doped drain region of the second conductivity type which is provided near the surface of the semiconductor substrate in a region narrower than a width of the gate electrode of the transistor.

Further, according to an embodiment of the present invention, a solid-state imaging apparatus includes a photoelectric conversion unit configured to store a signal charge according to incident light, a semiconductor device including an isolation region which is an impurity region of a first conductivity type, a source region and a drain region of a transistor which are impurity regions of a second conductivity type, a gate electrode of the transistor which is provided on an insulator layer on a surface of a semiconductor substrate formed with the isolation region and the source region and the drain region of the transistor, and a lightly doped drain region of the second conductivity type which is provided near the surface of the semiconductor substrate in a region narrower than a width of the gate electrode of the transistor, and an optical system configured to lead the incident light to the photoelectric conversion unit.

Since the lightly doped drain region is provided near the surface of the semiconductor substrate in the region narrower than the width of the gate electrode of the transistor, the lightly doped drain region does not exist on the outside of the gate electrode of the transistor in the width direction and formation of a leakage current path can be prevented.

Note that the width of the gate electrode refers to the length of the gate electrode in the width direction of the current path of the transistor.

With the method of manufacturing a semiconductor device, the semiconductor device, the solid-state imaging device, and the solid-state imaging apparatus according to an embodiment of the present invention, formation of a leakage current path can be prevented, and a short circuit of a transistor as well as a decrease in threshold voltage of a transistor can be prevented.

BRIEF DESCRIPTION OF THE DRAWINGS

FIGS. 10A to 10D are schematic views for illustrating an example of a method of manufacturing a solid-state imaging device according to the still other embodiment of the present invention;

FIGS. 14A and 14B are schematic views for illustrating a region in which a lightly doped drain is formed.

DESCRIPTION OF THE PREFERRED EMBODIMENTS

Modes for carrying out the invention (hereinafter referred to as embodiments) will be described below in the following order.

1. Embodiment (a case where a lightly doped drain is formed in an entire active region)

Figure 1:
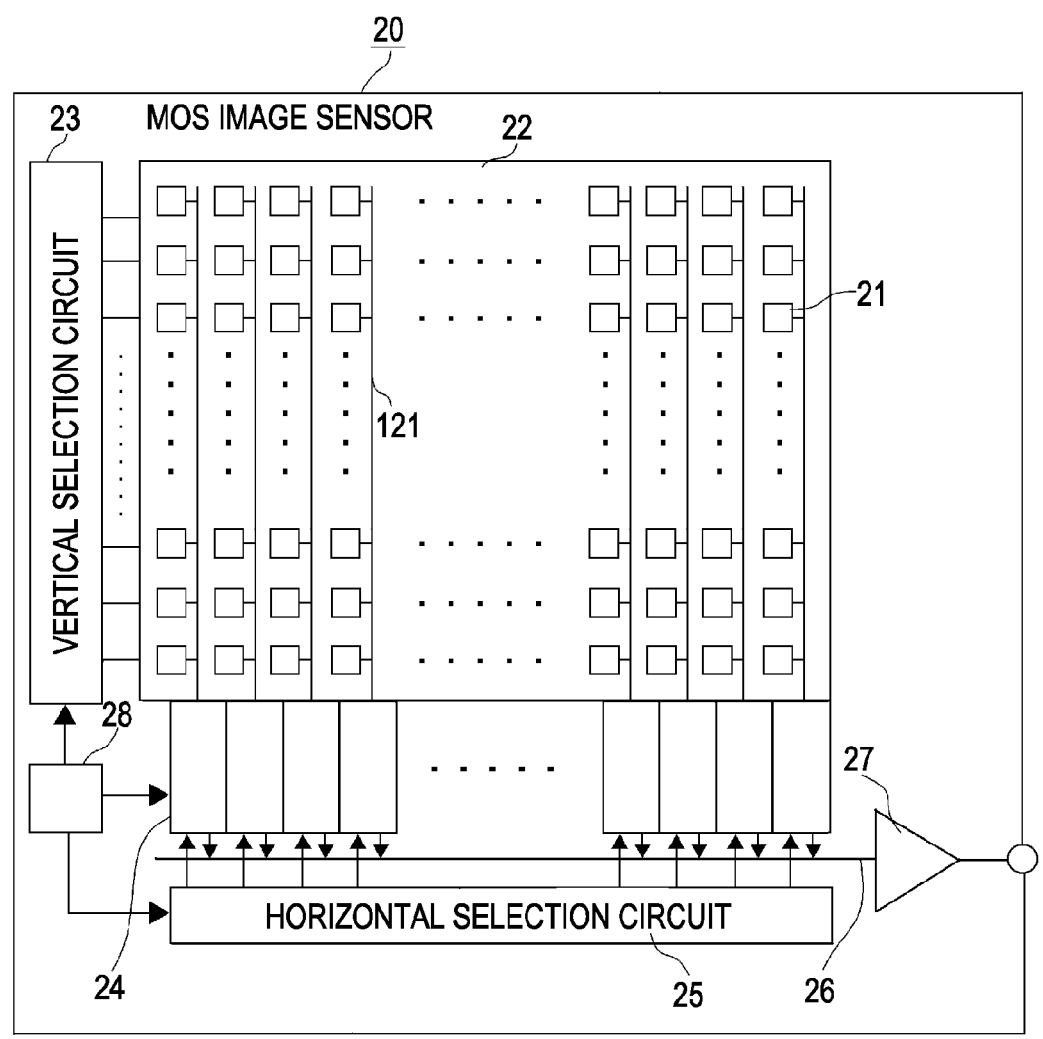
FIG. 1 is a schematic view for illustrating a MOS image sensor as an example of a solid-state imaging device according to an embodiment of the present invention.

2. Another embodiment (a case where a lightly doped drain is formed also in an isolation region)
3. Still another embodiment (a case where a lightly doped drain is formed in a part of an active region)
4. Yet another embodiment (description on a camera system)
5. Modification example 1. Embodiment Configuration of a Solid-State Imaging Device FIG. 1 is a schematic view for illustrating a MOS image sensor as an example of a solid-state imaging device according to an embodiment of the present invention. A MOS image sensor 20 shown herein includes a pixel array unit 22, a vertical selection circuit 23, a column circuit 24 which is a signal processing circuit, a horizontal selection circuit 25, a horizontal signal line 26, an output circuit 27, and a timing generator 28.

In the pixel array unit 22, a regular two-dimensional array is formed with unit pixels 21 including a photoelectric conversion unit, e.g., a photodiode, and a vertical signal line 121 is arranged for each column of the pixel array in matrix form.

The vertical selection circuit 23 selectively drives the respective pixels 21 of the pixel array unit 22 on a row-by-row basis by sequentially outputting a transfer signal for driving a transfer transistor 112 of the pixel 21 or a control signal such as a reset signal for driving a reset transistor 113 on a row-by-row basis. Also, the vertical selection circuit 23 includes, for example, a shift resistor. Note that the transfer transistor and the reset transistor will be described later.

The column circuit 24 is a signal processing circuit arranged for each column of the pixels of the pixel array unit 22, i.e., each of the vertical signal lines 121. For example, the column circuit 24 includes a sample and hold (S/H) circuit and a correlated double sampling (CDS) circuit.

The horizontal selection circuit 25 includes a shift resistor, and sequentially selects a signal of the respective pixels 21 output through the column circuit 24 so as to be output to the horizontal signal line 26.

Note that although a horizontal selection switch is omitted in FIG. 1 to simplify the drawing, the horizontal selection switch is sequentially turned on or off on a column-by-column basis by the horizontal selection circuit 25.

Note that the signal of the unit pixel 21 sequentially output for each column from the column circuit 24 selectively driven by the horizontal selection circuit 25 is supplied to the output circuit 27 through the horizontal signal line 26, subjected to signal processing such as amplification in the output circuit 27, and then output outside a device.

The timing generator 28 generates various timing signals and performs drive control of the vertical selection circuit 23, the column circuit 24, the horizontal selection circuit 25, or the like based on the various timing signals.

Figure 2A:
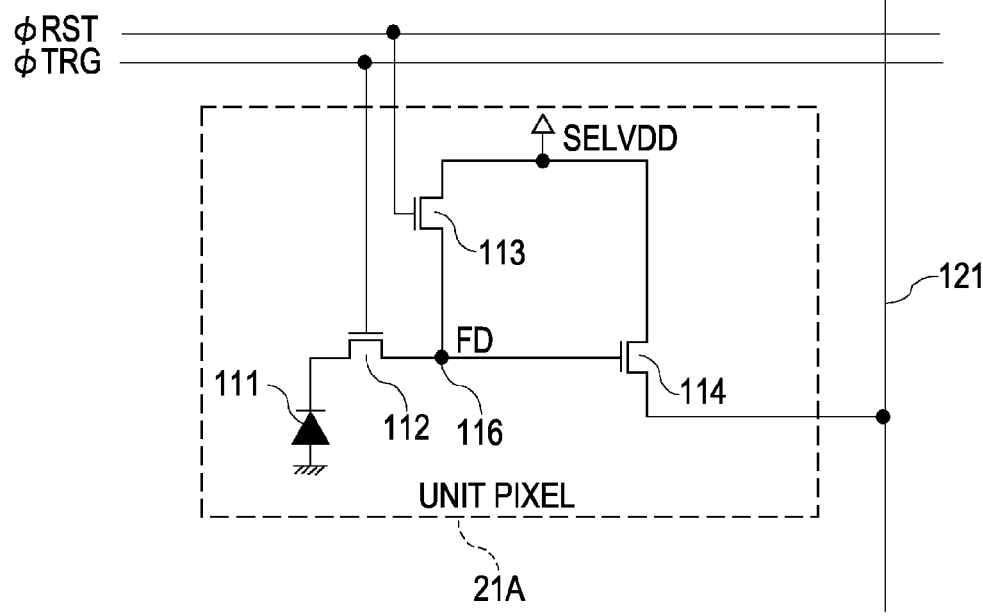
FIGS. 2A and 2B are schematic views for illustrating the circuit configuration of a unit pixel.

FIG. 2A is a schematic view for illustrating the circuit configuration of the unit pixel 21. The unit pixel 21 shown herein has a pixel circuit including three pixel transistors, i.e., the transfer transistor 112, the reset transistor 113, and an amplification transistor 114, in addition to a photodiode 111.

Note that, herein, a case where n-channel MOS transistors are used as the pixel transistors 112 to 114 is given as an example.

The transfer transistor 112 is connected between a cathode of the photodiode 111 and a floating diffusion (FD) unit 116. The transfer transistor 112 transfers a signal charge (electron) obtained from photoelectric conversion and stored in the photodiode 111 to the FD unit 116 by applying a transfer pulse φTRG to the gate.

The drain and source of the reset transistor 113 are respectively connected to a selection power supply SELVDD and the FD unit 116. The reset transistor 113 resets the electrical potential of the FD unit 116 by applying a reset pulse φRST to the gate before transfer of the signal charge from the photodiode 111 to the FD unit 116.

Note that the selection power supply SELVDD is a power supply that selectively adopts VDD level and GND level as a power supply voltage.

The amplification transistor 114 has a source follower configuration in which the gate, the drain, and the source are respectively connected to the FD unit 116, the selection power supply SELVDD, and the vertical signal line 121. The amplification transistor 114 shifts to an operation state when the selection power supply SELVDD shifts to VDD level to select a pixel 21A, and outputs the electrical potential of the FD unit 116 after reset by the reset transistor 113 as a reset level to the vertical signal line 121. Further, the amplification transistor 114 outputs the electrical potential of the FD unit 116 after the transfer of the signal charge by the transfer transistor 112 as a signal level to the vertical signal line 121.

Figure 3:
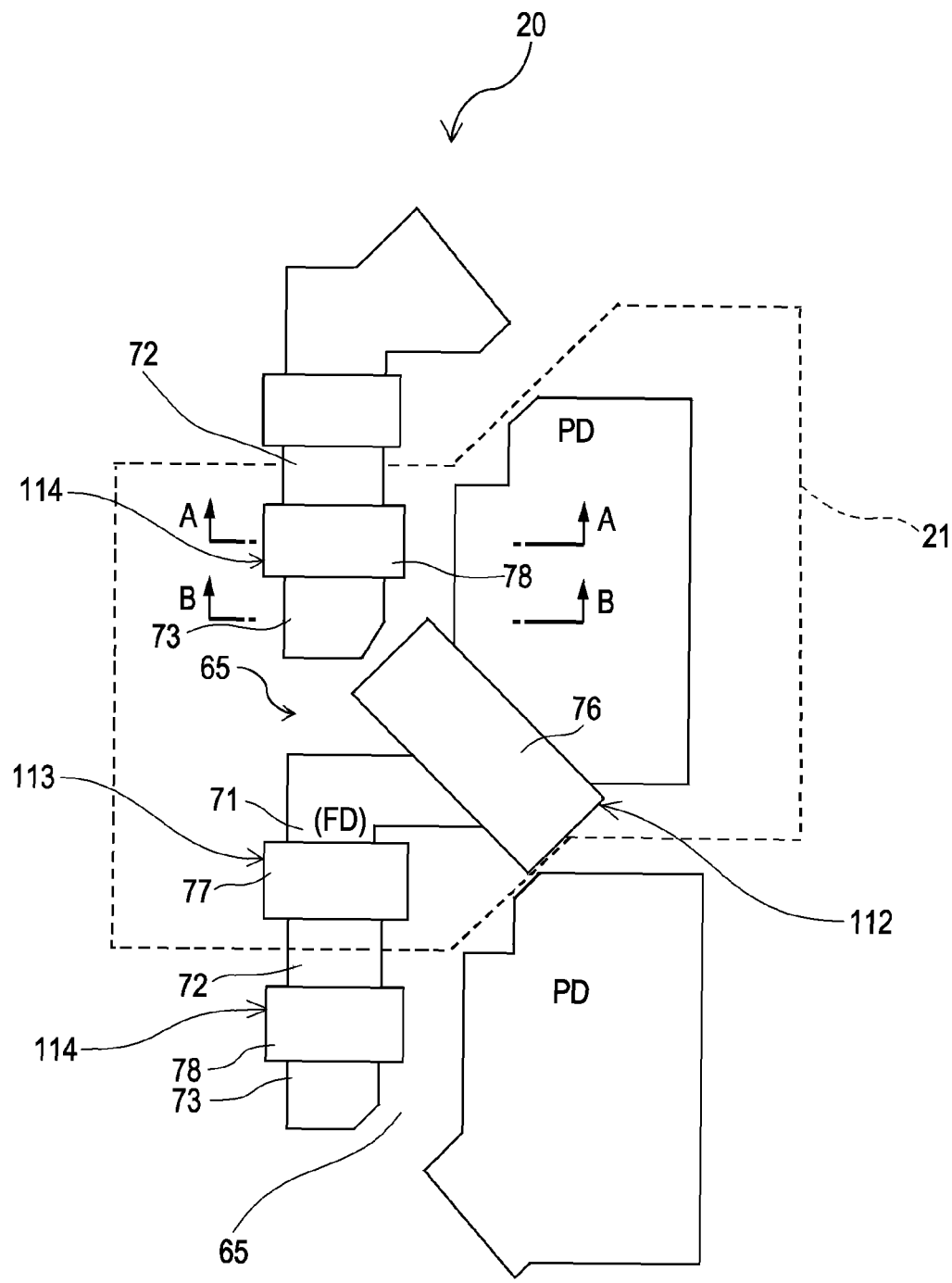
FIG. 3 is a schematic view for illustrating a planar layout of a main portion of a pixel array unit.
Figure 4A:
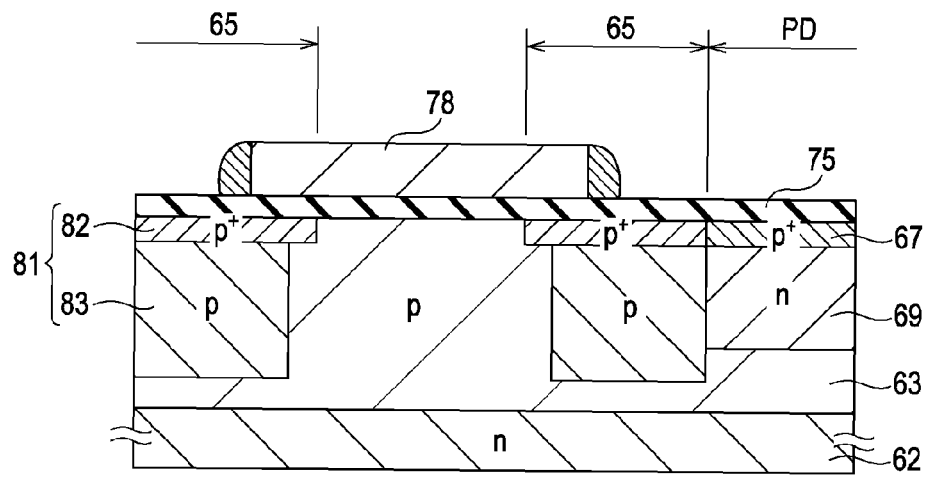
FIGS. 4A and 4B are schematic views for illustrating the sectional structure along line A-A and line B-B in FIG. 3.
Figure 4B:
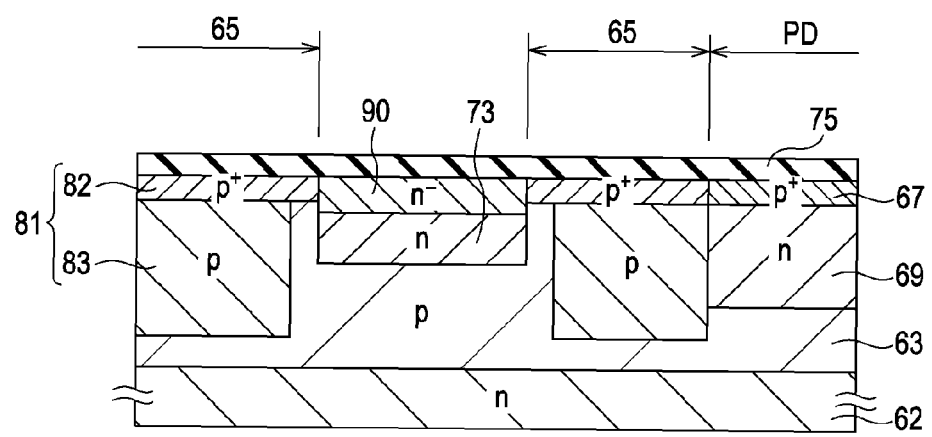

FIG. 3 is a schematic view for illustrating a planar layout of a main portion of the pixel array unit 22, FIG. 4A is a schematic view for illustrating the sectional structure along line A-A in FIG. 3, and FIG. 4B is a schematic view for illustrating the sectional structure along line B-B in FIG. 3.

In the MOS image sensor 20 according to the embodiment, a first conductivity type, e.g., p-type semiconductor well region 63 is formed on a semiconductor substrate (for example, n-type silicon substrate) 62 of a second conductivity type. The unit pixels 21 formed of the photodiode PD as the photoelectric conversion unit and the multiple transistors are arranged two-dimensionally on the p-type semiconductor well region 63, and an isolation region 65 is formed between the adjacent pixels 21 and within the unit pixel 21.

The photodiode PD forms an HAD sensor including a p-type semiconductor region 67 of the first conductivity type at the boundary of a silicon substrate surface and an insulator layer 75 and an n-type charge storage region 69 of the second conductivity type underneath that stores the signal charge from photoelectric conversion.

The transfer transistor 112 includes a charge storage region 69 of the photodiode PD, an n-type source/drain region (drain region herein) 71 of the second conductivity type as the FD unit, and a transfer gate electrode 76 formed on the gate insulator layer 75.

The reset transistor 113 includes a pair of the n-type source/drain region (source region herein) 71 and an n-type source/drain region (drain region herein) 72 and a reset gate electrode 77 formed on the gate insulator layer 75.

The amplification transistor 114 includes a pair of the n-type source/drain region (drain region herein) 72 and an n-type source/drain region (source region herein) 73 and an amplification gate electrode 78 formed on the gate insulator layer 75.

In the MOS image sensor 20 according to the embodiment, the isolation region 65 includes a p-type semiconductor region 81, of which the conductivity type is opposite to those of the n-type source/drain regions 71 to 73 of the second conductivity type in the respective transistors, formed in the p-type semiconductor well region 63.

Specifically, on the surface side of the semiconductor well region 63, the p-type semiconductor region 81 is formed of a relatively shallow and highly-concentrated $p^+$ semiconductor region 82 and a p-type semiconductor region 83 adjacent to the p+ semiconductor region and having a depth that enables isolation.

Note that, on the isolation region formed by the p-type semiconductor region 81, i.e., on the so-called silicon substrate, the insulator layer 75 is formed to have a thickness equivalent to that of a gate insulator layer.

Figure 5A:
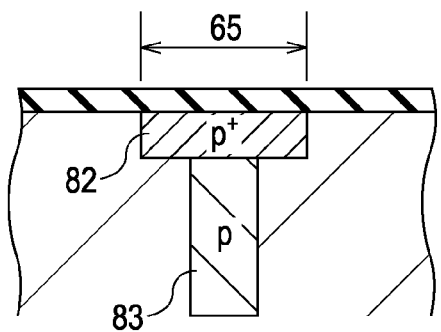
FIGS. 5A to 5E are schematic views for illustrating the configuration of an isolation region.
Figure 5B:
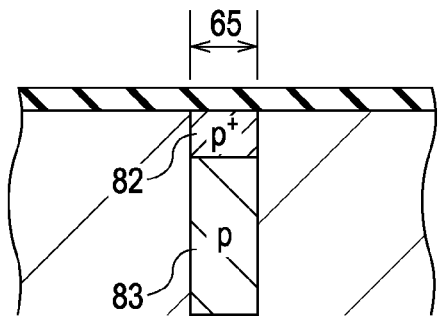
Figure 5C:
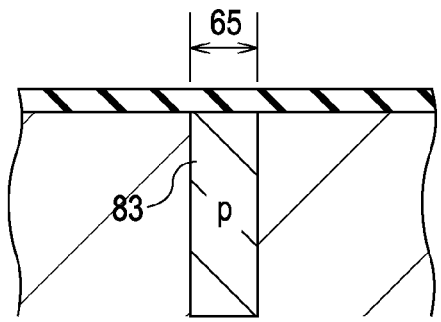
Figure 5D:
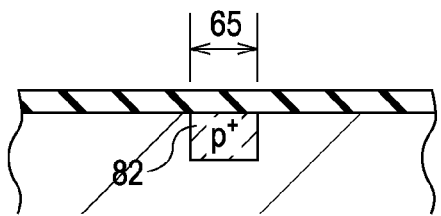
Figure 5E:
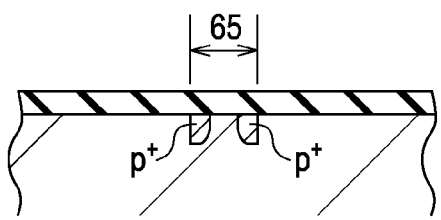

The p-type semiconductor region 81 included in the isolation region 65 may have a configuration (see FIG. 5A) in which the width of the p-type semiconductor region 83 is narrower than that of the p+ semiconductor region 82 or a configuration (see FIG. 5B) in which the widths of the p+ semiconductor region 82 and the p-type semiconductor region 83 are the same. A configuration (see FIG. 5C) with only the p-type semiconductor region 83 is also acceptable. Further, the p-type semiconductor region 81 included in the isolation region 65 may have a configuration shown in FIG. 5D or FIG. 5E.

In regions near the surface of the n-type source/drain regions 71 to 73 of the second conductivity type in the respective transistors, a lightly doped drain region 90 which is a low-concentrated n⁻-type semiconductor region is formed (see FIG. 4B).

Specifically, the lightly doped drain region 90 having the same width as a channel width is formed.

[Manufacturing Method]

A method of manufacturing the MOS image sensor 20 configured in a manner described above will be described below. That is, an example of a method of manufacturing the solid-state imaging device according to the embodiment of the present invention will be described. Note that only the amplification transistor 114 is shown in FIGS. 6A to 6D to simplify the drawings.

In the example of the method of manufacturing the solid-state imaging device according to the embodiment of the present invention, the p-type semiconductor well region 63 of the first conductivity type is first formed on the semiconductor substrate (for example, n-type silicon substrate) 62 of the second conductivity type. Also, the n-type charge storage region 69 of the photodiode PD is formed in the p-type semiconductor well region 63 (see FIG. 6A).

Figure 6A:
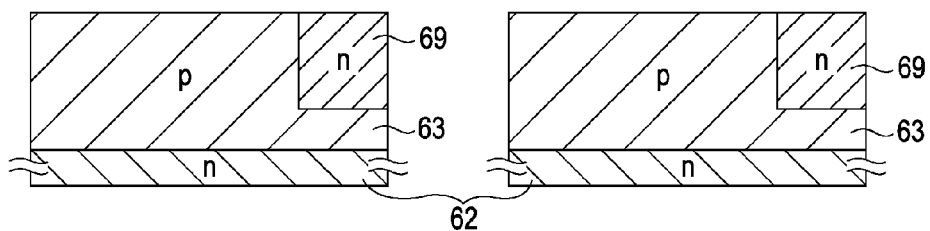
FIGS. 6A to 6D are schematic views for illustrating an example of a method of manufacturing a solid-state imaging device according to the embodiment of the present invention.
Figure 6B:
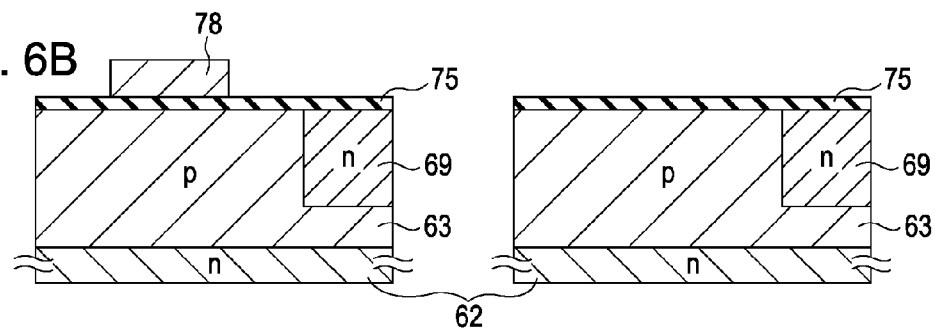

Next, the insulator layer 75 is formed by thermal oxidation on the surface of the n-type silicon substrate 62, and then the gate electrodes 76 to 78 are formed with, for example, a polysilicon layer (see FIG. 6B).

Also, a first ion implantation of a p-type impurity (for example, boron) is performed to form the relatively low-concentrated p-type semiconductor region 83 in a region for the isolation region 65.

Figure 6C:
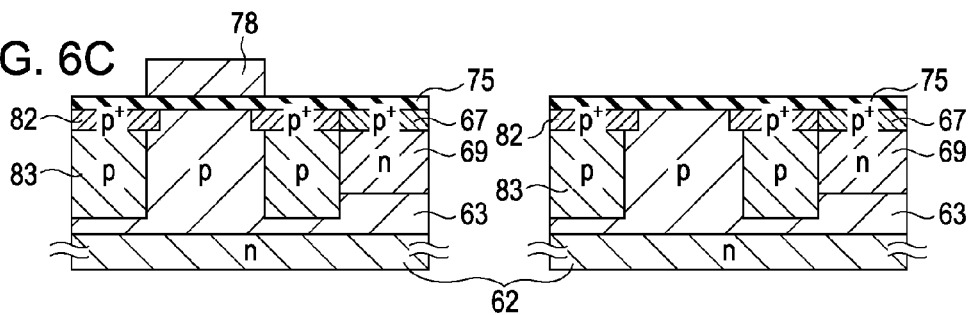

Subsequently, a second ion implantation of a p-type impurity (for example, boron) is performed to form the p-type semiconductor region 67 on the surface of the n-type charge storage region 69 and the p+ semiconductor region 82 for the isolation region 65 (see FIG. 6C).

Figure 12A:
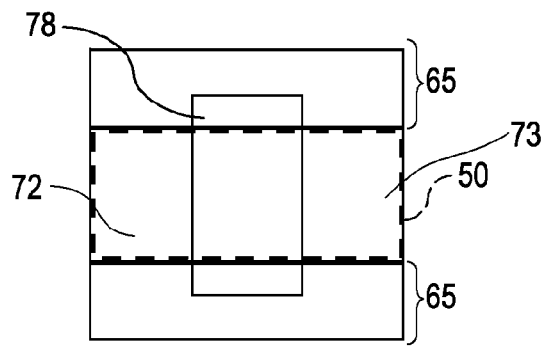
FIGS. 12A to 12C are schematic views for illustrating a pattern of a mask.

Next, with general photolithography technology and etching technology, a mask 51 having a pattern including an opening portion 50 having the same width as an active region of the transistor is formed (see FIG. 12A).

Figure 6D:
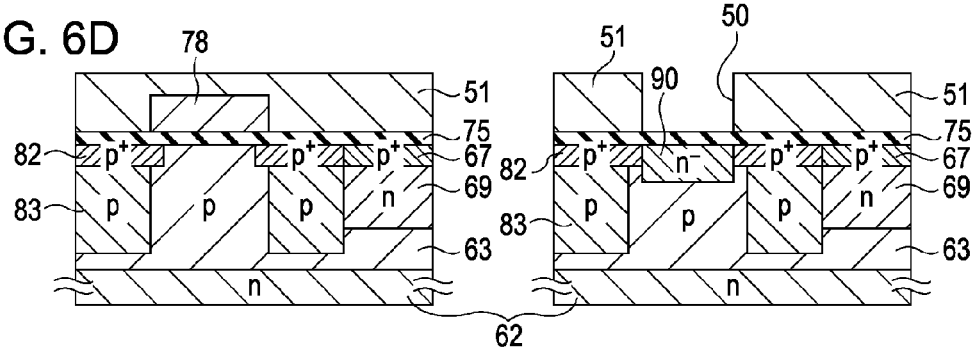

Subsequently, an ion implantation of an n-type impurity (for example, arsenic or phosphorus) is performed to form the lightly doped drain region 90 which is the low-concentrated n⁻-type semiconductor region (see FIG. 6D).

Next, a sidewall is formed with a general method, and then the source region and the drain region for the transistor are subsequently formed in the p-type semiconductor well region 63. Thus, the MOS image sensor 20 shown in FIGS. 4A and 4B can be obtained.

Although a case where the isolation region 65 is formed after the gate electrodes 76 to 78 are formed is described as the example for the method of manufacturing the MOS image sensor according to the embodiment, the gate electrodes 76 to 78 may be formed after the isolation region 65 is formed.

However, by forming the isolation region 65 after the gate electrodes 76 to 78 are formed, it is possible to prevent a photodiode PD region from being reduced by diffusion of the impurity implanted in the isolation region 65 due to heat at the time of gate electrode formation.

Therefore, in terms of ensuring the photodiode PD region sufficiently, it is preferable to form the isolation region 65 after the gate electrodes 76 to 78 are formed.

In the MOS image sensor 20 according to the embodiment, the lightly doped drain region 90 is formed only near the surface of the source/drain regions 71 to 73, whereby formation of a leakage current path can be prevented. That is, since the lightly doped drain region 90 is not formed in the isolation region 65 located outside the gate electrodes 76 to 78 of the transistors in the width direction, formation of a leakage current path can be prevented.

Since formation of a leakage current path can be prevented, deterioration in the transistor characteristic such as a short circuit through the lightly doped drain region 90 or a decrease in threshold value of the transistor can be reduced. Thus, the transistor characteristic regarding noise due to formation of the lightly doped drain region 90 or the like can be improved also in an isolation structure using an impurity.

Specifically, a potential barrier beneath the sidewall can be reduced by forming the lightly doped drain region 90, and noise can be reduced by approximately 35%. It is also expected that a short-channel effect is prevented by forming the lightly doped drain region.

Note that the lightly doped drain region 90 may be not formed in the entire isolation region (active region) for a noise reduction effect. Therefore, the noise reduction effect can be obtained even if the lightly doped drain region 90 is not formed in the entire isolation region (active region) due to manufacturing error in this embodiment which uses the mask having the pattern in which the opening portion 50 and the active region of the transistor have the same widths.

Since the lightly doped drain region 90 is not formed in the isolation region 65 in the MOS image sensor 20 according to the embodiment, a decrease in isolation breakdown voltage can be prevented. That is, while a decrease in the isolation breakdown voltage is a concern when the n-type lightly doped drain region 90 is formed in the p-type isolation region 65, the decrease in the isolation breakdown voltage can be prevented in this embodiment since the lightly doped drain region 90 is not formed in the isolation region 65.

Note that it is conceivable to form the isolation region 65 as a low-concentrated p-type impurity region, since the n-type charge storage region of the photodiode PD may be narrowed when the isolation region 65 adjacent to the photodiode PD is formed as an excessively highly-concentrated p-type impurity region. Since the isolation breakdown voltage may be exceeded due to the lightly doped drain region 90 formed in the isolation region 65 in such a case, it is extremely important not to form the lightly doped drain region 90 in the isolation region 65 as in this embodiment.

2. Another Embodiment

Configuration of a Solid-State Imaging Device

In a similar manner to the embodiment described earlier, the MOS image sensor 20 according to another embodiment also includes the pixel array unit 22, the vertical selection circuit 23, the column circuit 24, the horizontal selection circuit 25, the horizontal signal line 26, the output circuit 27, and the timing generator 28.

Note that the configurations of the pixel array unit 22, the vertical selection circuit 23, the column circuit 24, the horizontal selection circuit 25, the timing generator 28, and the like are similar to those according to the embodiment described earlier.

Figure 7A:
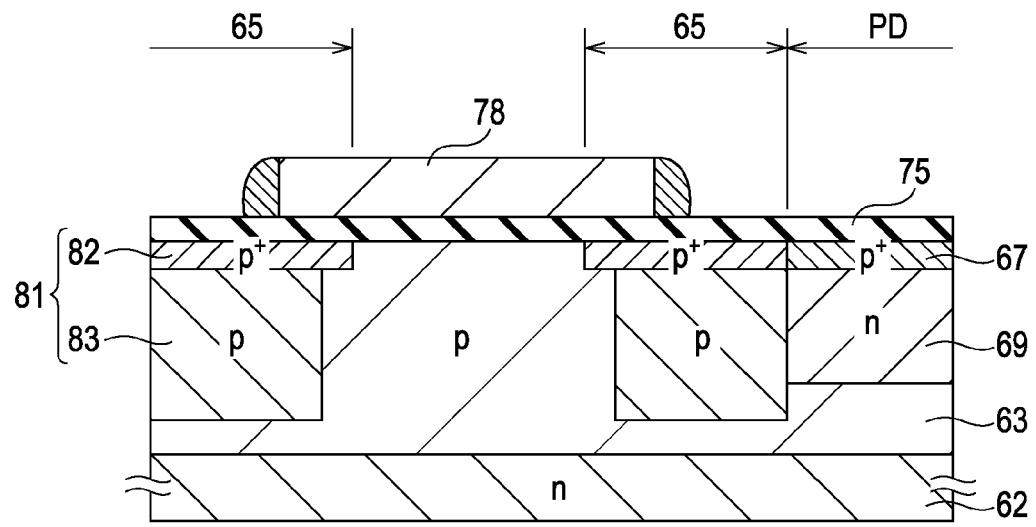
FIGS. 7A and 7B are schematic views for illustrating the sectional structure of a pixel array unit of a MOS image sensor as an example of a solid-state imaging device according to another embodiment of the present invention.
Figure 7B:
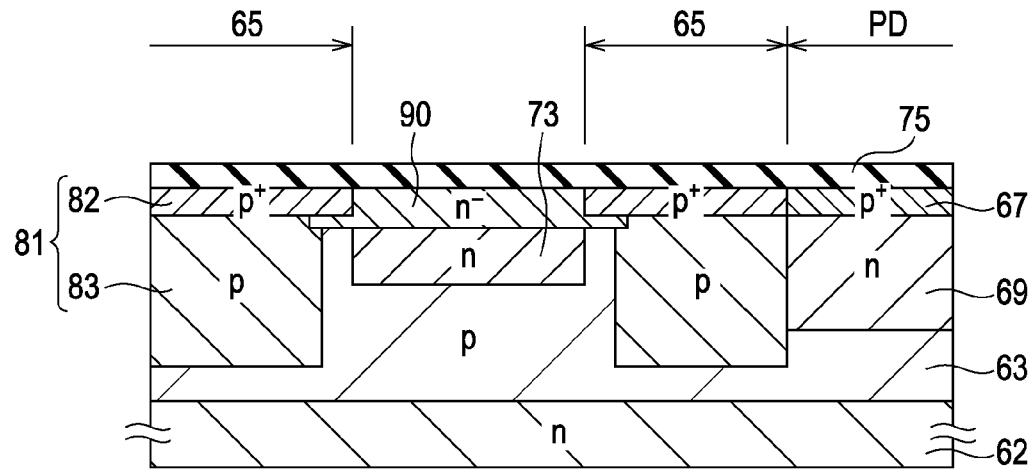

FIGS. 7A and 7B are schematic views for illustrating the sectional structure of the pixel array unit 22 of the MOS image sensor 20 as an example of a solid-state imaging device according to the other embodiment of the present invention.

Note that the MOS image sensors 20 according to the embodiment described earlier and this embodiment share the same planar layout for the main portion of the pixel array unit 22 (see FIG. 3). FIG. 7A shows the sectional structure along the line A-A in FIG. 3, and FIG. 7B shows the sectional structure along the line B-B in FIG. 3.

In the MOS image sensor 20 according to the embodiment, the first conductivity type, e.g., p-type semiconductor well region 63 is formed on the semiconductor substrate (for example, n-type silicon substrate) 62 of the second conductivity type in a similar manner to the embodiment described earlier. The unit pixels 21 formed of the photodiode PD and the multiple transistors are arranged two-dimensionally on the p-type semiconductor well region 63, and the isolation region 65 is formed between the adjacent pixels 21 and within the unit pixel 21, also in a similar manner to the embodiment described earlier.

Note that the configurations of the photodiode PD, the transfer transistor 112, the reset transistor 113, the amplification transistor 114, and the isolation region 65 are also similar to those according to the embodiment described earlier.

In the MOS image sensor 20 according to the embodiment, the lightly doped drain region 90 which is the low-concentrated n⁻-type semiconductor region is formed in regions near the surface narrower than the widths of the gate electrodes 76 to 78 of the respective transistors, as shown in FIG. 7B.

Specifically, the lightly doped drain region 90 having a width wider than the channel width and narrower than a gate electrode width is formed.

[Manufacturing Method]

A method of manufacturing the MOS image sensor 20 according to the embodiment configured in a manner described above will be described below. That is, an example of a method of manufacturing the solid-state imaging device according to the embodiment of the present invention will be described. Note that only the amplification transistor 114 is shown in FIGS. 8A to 8D to simplify the drawings.

In the example of the method of manufacturing the solid-state imaging device according to the embodiment of the present invention, the p-type semiconductor well region 63 of the first conductivity type is first formed on the semiconductor substrate (for example, n-type silicon substrate) 62 of the second conductivity type. Also, the n-type charge storage region 69 of the photodiode PD is formed in the p-type semiconductor well region (see FIG. 8A).

Figure 8A:
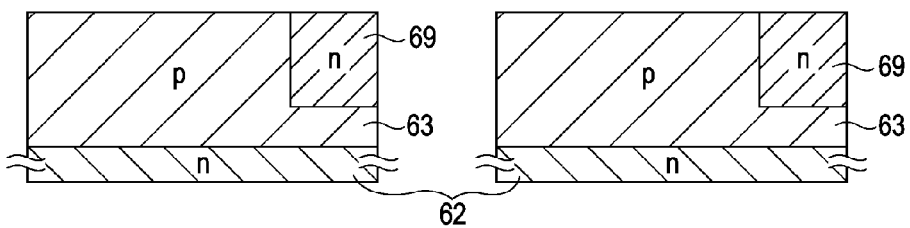
FIGS. 8A to 8D are schematic views for illustrating an example of a method of manufacturing a solid-state imaging device according to the other embodiment of the present invention.
Figure 8B:
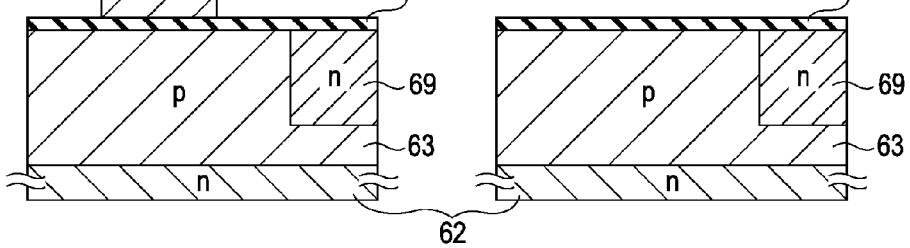

Next, the insulator layer 75 is formed by thermal oxidation on the surface of the n-type silicon substrate 62, and then the gate electrodes 76 to 78 are formed with, for example, a polysilicon layer (see FIG. 8B).

Also, a first ion implantation of a p-type impurity (for example, boron) is performed to form the relatively low-concentrated p-type semiconductor region 83 in a region for the isolation region 65.

Figure 8C:
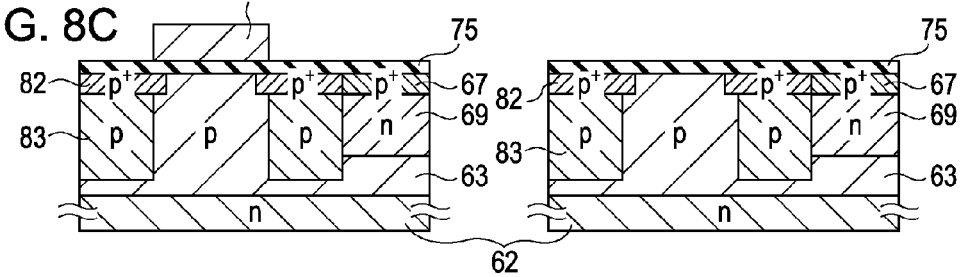

Subsequently, a second ion implantation of a p-type impurity (for example, boron) is performed to form the p-type semiconductor region 67 on the surface of the n-type charge storage region 69 and the p⁺ semiconductor region 82 for the isolation region 65 (see FIG. 8C).

Figure 12B:
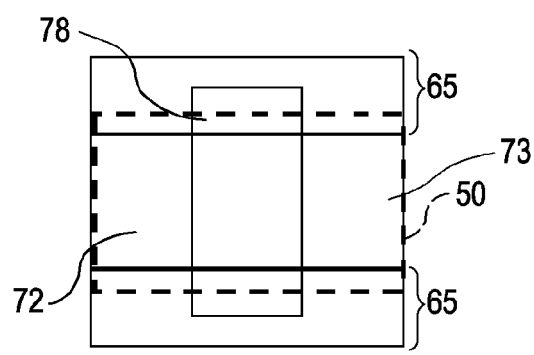

Next, with general photolithography technology and etching technology, a mask having a pattern including the opening portion 50 having a width wider than the active region of the transistor and narrower than the width of the gate electrode of the transistor is formed (see FIG. 12B).

Figure 8D:
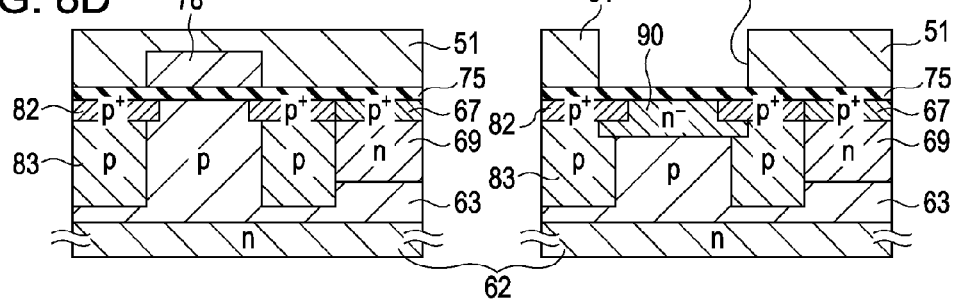

Subsequently, an ion implantation of an n-type impurity (for example, arsenic or phosphorus) is performed to form the lightly doped drain region 90 which is the low-concentrated n⁻-type semiconductor region (see FIG. 8D).

Next, a sidewall is formed with a general method, and then the source region and the drain region for the transistor are formed in the p-type semiconductor well region 63. Thus, the MOS image sensor 20 shown in FIGS. 7A and 7B can be obtained.

In the MOS image sensor 20 according to the embodiment, the lightly doped drain region 90 is formed only near the surface in regions narrower than the widths of the gate electrodes 76 to 78 of the transistors, whereby formation of a leakage current path can be prevented. That is, since the lightly doped drain region 90 is not formed in the isolation region 65 located outside the gate electrodes 76 to 78 of the transistors in the width direction, formation of a leakage current path can be prevented.

Since formation of a leakage current path can be prevented, deterioration in the transistor characteristic such as a short circuit through the lightly doped drain region 90 or a decrease in threshold value of the transistor can be reduced. Thus, the transistor characteristic regarding noise due to formation of the lightly doped drain region 90 or the like can be improved also in the isolation structure using an impurity.

Specifically, a potential barrier beneath the sidewall can be reduced by forming the lightly doped drain region 90, and noise can be reduced by approximately 35%. It is also expected that a short-channel effect is prevented by forming the lightly doped drain region.

3. Still Another Embodiment

Configuration of a Solid-State Imaging Device

In a similar manner to the embodiment described first, the MOS image sensor 20 according to still another embodiment also includes the pixel array unit 22, the vertical selection circuit 23, the column circuit 24, the horizontal selection circuit 25, the horizontal signal line 26, the output circuit 27, and the timing generator 28.

Note that the configurations of the pixel array unit 22, the vertical selection circuit 23, the column circuit 24, the horizontal selection circuit 25, the timing generator 28, and the like are similar to those according to the embodiment described first.

Figure 9A:
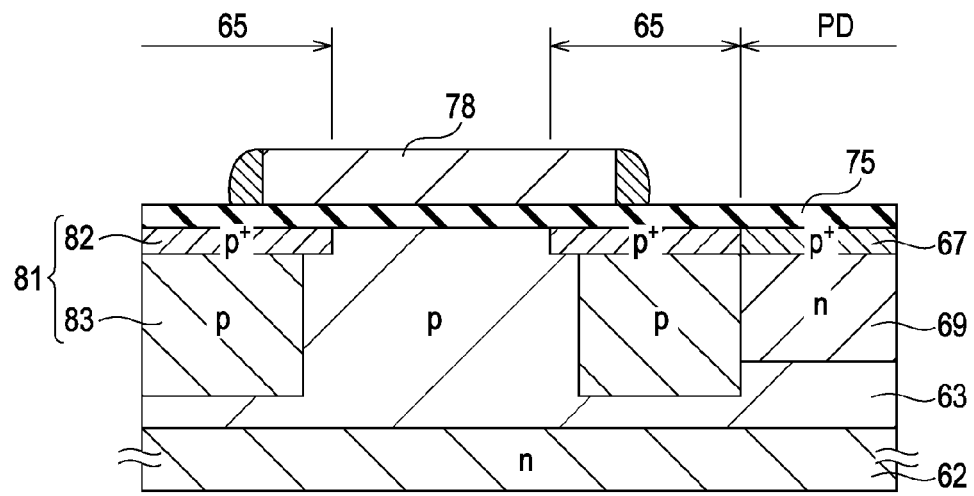
FIGS. 9A and 9B are schematic views for illustrating the sectional structure of a pixel array unit of a MOS image sensor as an example of a solid-state imaging device according to still another embodiment of the present invention.
Figure 9B:
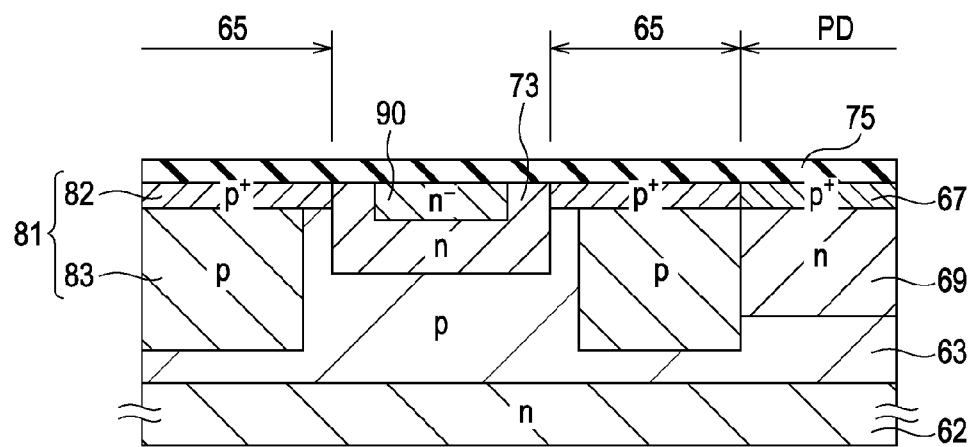

FIGS. 9A and 9B are schematic views for illustrating the sectional structure of the pixel array unit 22 of the MOS image sensor 20 as an example of a solid-state imaging device according to the still other embodiment of the present invention.

Note that the MOS image sensors 20 according to the embodiment described first and this embodiment share the same planar layout for the main portion of the pixel array unit 22 (see FIG. 3). FIG. 9A shows the sectional structure along the line A-A in FIG. 3, and FIG. 9B shows the sectional structure along the line B-B in FIG. 3.

In the MOS image sensor 20 according to the embodiment, the first conductivity type, e.g., p-type semiconductor well region 63 is formed on the semiconductor substrate (for example, n-type silicon substrate) 62 of the second conductivity type in a similar manner to the embodiment described first. The unit pixels 21 formed of the photodiode PD and the multiple transistors are arranged two-dimensionally on the p-type semiconductor well region 63, and the isolation region 65 is formed between the adjacent pixels 21 and within the unit pixel 21, also in a similar manner to the embodiment described first.

Note that the configurations of the photodiode PD, the transfer transistor 112, the reset transistor 113, the amplification transistor 114, and the isolation region 65 are also similar to those according to the embodiment described first.

In the MOS image sensor 20 according to the embodiment, the lightly doped drain region 90 which is the low-concentrated n$^-$-type semiconductor region is formed in regions near the surface narrower than the widths of the n-type source/drain regions 71 to 73 of the respective transistors, as shown in FIG. 9B.

Specifically, the lightly doped drain region 90 having a width narrower than the channel width is formed.

[Manufacturing Method]

A method of manufacturing the MOS image sensor 20 according to the embodiment configured in a manner described above will be described below. That is, an example of a method of manufacturing the solid-state imaging device according to the embodiment of the present invention will be described. Note that only the amplification transistor 114 is shown in FIGS. 10A to 10D to simplify the drawings.

In the example of the method of manufacturing the solid-state imaging device according to the embodiment of the present invention, the p-type semiconductor well region 63 of the first conductivity type is first formed on the semiconductor substrate (for example, n-type silicon substrate) 62 of the second conductivity type. Also, the n-type charge storage region 69 of the photodiode PD is formed in the p-type semiconductor well region (see FIG. 10A).

Next, the insulator layer 75 is formed by thermal oxidation on the surface of the n-type silicon substrate 62, and then the gate electrodes 76 to 78 are formed with, for example, a polysilicon layer (see FIG. 10B).

Also, a first ion implantation of a p-type impurity (for example, boron) is performed to form the relatively low-concentrated p-type semiconductor region 83 in a region for the isolation region 65.

Subsequently, a second ion implantation of a p-type impurity (for example, boron) is performed to form the p-type semiconductor region 67 on the surface of the n-type charge storage region 69 and the p$^+$ semiconductor region 82 for the isolation region 65 (see FIG. 10C).

Figure 12C:
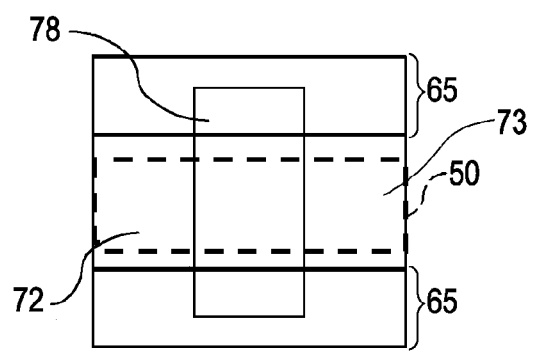
Figure 13:
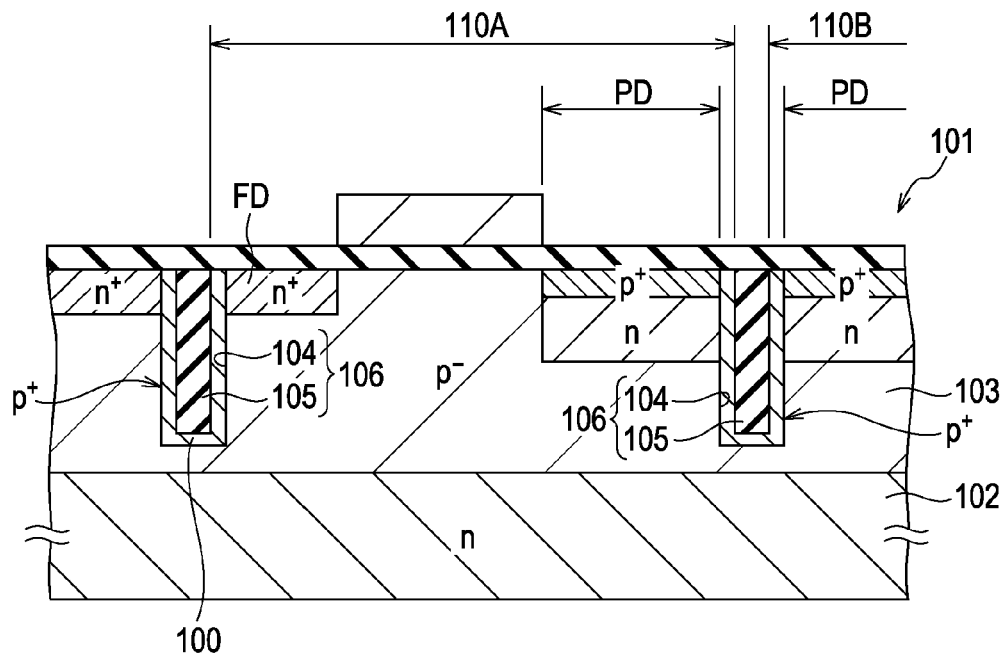
FIG. 13 is a schematic view for illustrating the sectional structure of a main portion of a solid-state imaging device in which the STI method is used for isolation.

Next, with general photolithography technology and etching technology, a mask having a pattern including the opening portion 50 having a narrower width than the active region of the transistor is formed (see FIG. 12C).

Subsequently, an ion implantation of an n-type impurity (for example, arsenic or phosphorus) is performed to form the lightly doped drain region 90 which is the low-concentrated n$^-$-type semiconductor region (see FIG. 10D).

Next, a sidewall is formed with a general method, and then the source region and the drain region for the transistor are formed in the p-type semiconductor well region 63. Thus, the MOS image sensor 20 shown in FIGS. 9A and 9B can be obtained.

In the MOS image sensor 20 according to the embodiment, the lightly doped drain region 90 is formed only near the surface in regions narrower than the widths of the active regions of the transistors, whereby formation of a leakage current path can be prevented. That is, since the lightly doped drain region 90 is not formed in the isolation region 65 located outside the gate electrodes 76 to 78 of the transistors in the width direction, formation of a leakage current path can be prevented.

Since formation of a leakage current path can be prevented, deterioration in the transistor characteristic such as a short circuit through the lightly doped drain region 90 or a decrease in threshold value of the transistor can be reduced. Thus, the transistor characteristic regarding noise due to formation of the lightly doped drain region 90 or the like can be improved also in the isolation structure using an impurity.

Specifically, a potential barrier beneath the sidewall can be reduced by forming the lightly doped drain region 90, and noise can be reduced by approximately 35%. It is also expected that a short-channel effect is prevented by forming the lightly doped drain region.

Note that the lightly doped drain region 90 may be not formed in the entire isolation region (active region) for a noise reduction effect.

Since the lightly doped drain region 90 is not formed in the isolation region 65 in the MOS image sensor 20 according to the embodiment, a decrease in isolation breakdown voltage can be prevented in a similar manner to the embodiment described first. That is, while a decrease in the isolation breakdown voltage is a concern when the n-type lightly doped drain region 90 is formed in the p-type isolation region 65, the decrease in the isolation breakdown voltage can be prevented in this embodiment since the lightly doped drain region 90 is not formed in the isolation region 65.

Note that it is conceivable to form the isolation region 65 as a low-concentrated p-type impurity region, since the n-type charge storage region of the photodiode PD may be narrowed when the isolation region 65 adjacent to the photodiode PD is formed as an excessively highly-concentrated p-type impurity region. Since the isolation breakdown voltage may be exceeded due to the lightly doped drain region 90 formed in the isolation region 65 in such a case, it is extremely important not to form the lightly doped drain region 90 in the isolation region 65 as in this embodiment.

4. Yet Another Embodiment

Configuration of a Solid-State Imaging Apparatus

Figure 11:
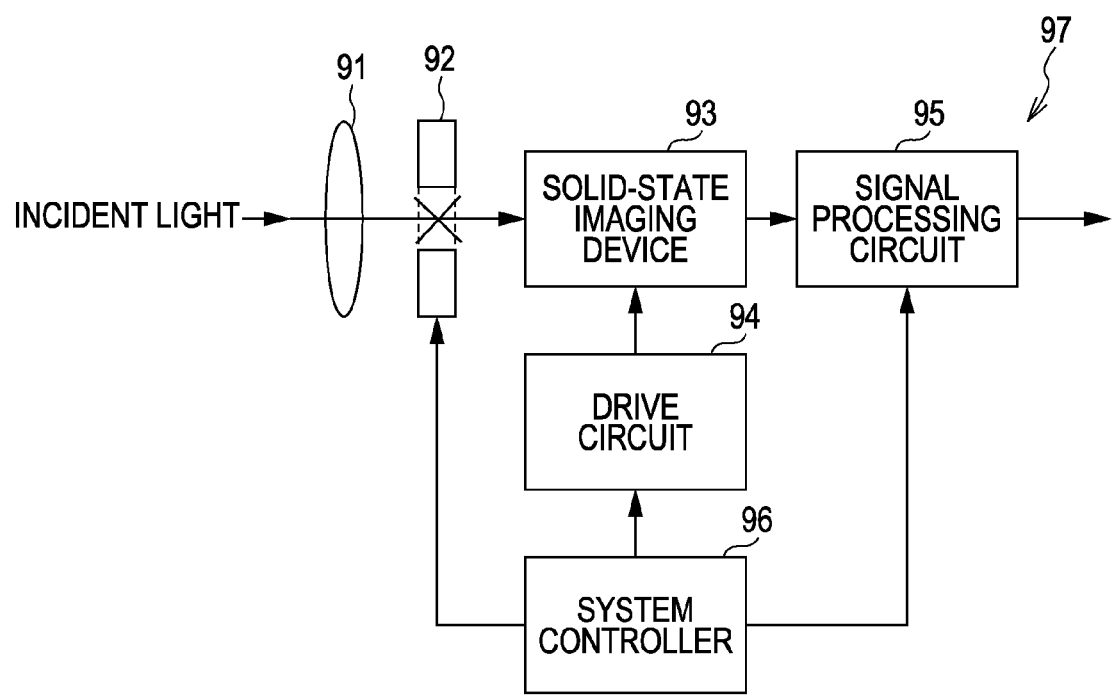
FIG. 11 is a schematic view for illustrating a camera as an example of a solid-state imaging apparatus according to yet another embodiment of the present invention.

FIG. 11 is a schematic view for illustrating a camera 97 as an example of a solid-state imaging apparatus according to yet another embodiment of the present invention. In the camera 97 shown herein, the solid-state imaging device according to the embodiment described first is used as an imaging device.

In the camera 97 according to the embodiment of the present invention, light from an object (not shown) enters an imaging area of the solid-state imaging device through an optical system such as a lens 91 and a mechanical shutter 92.

Note that the mechanical shutter 92 blocks incident light upon the imaging area of a solid-state imaging device 93 and determines the exposure time.

The solid-state imaging device 93 uses the MOS image sensor 20 according to the embodiment described first, and is driven by a timing generator 28 or a drive circuit 94 including a drive system or the like.

An output signal of the solid-state imaging device 93 is subjected to various signal processing by a signal processing circuit 95 at the next stage, and is sent externally as an imaging signal. The sent imaging signal is stored in a storage medium such as a memory or output to a monitor.

Note that opening/closing control of the mechanical shutter 92, control of the drive circuit 94, control of the signal processing circuit 95, and the like are performed by a system controller 96.

Since the camera 97 according to the embodiment of the present invention employs the solid-state imaging device according to the embodiment described first of the present invention, the transistor characteristic can be improved also in the isolation structure using an impurity and a high-definition image can be obtained as a result.

5. Modification Example

Circuit Configuration of a Pixel

Figure 2B:
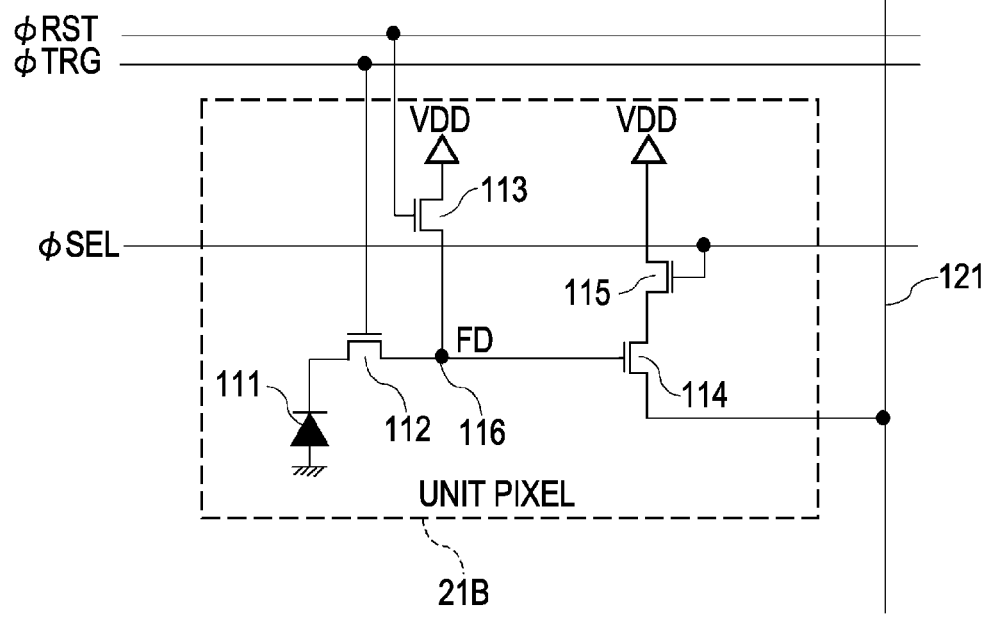

Although cases where the unit pixel 21 has the circuit configuration shown in FIG. 2A have been described as the examples in the embodiments described above, the circuit configuration of the unit pixel 21 is not limited to that shown in FIG. 2A and may be, for example, a circuit configuration shown in FIG. 2B.

A unit pixel 21B shown herein has a pixel circuit including four pixel transistors, i.e., the transfer transistor 112, the reset transistor 113, the amplification transistor 114, and a selection transistor 115, in addition to the photodiode 111.

Note that, herein, a case where n-channel MOS transistors are used as the pixel transistors 112 to 115 is given as an example.

The transfer transistor 112 is connected between the cathode of the photodiode 111 and the FD unit 116. The transfer transistor 112 transfers a signal charge (electron) obtained from photoelectric conversion and stored in the photodiode 111 to the FD unit 116 by applying the transfer pulse φTRG to the gate.

The drain and source of the reset transistor 113 are respectively connected to a power supply VDD and the FD unit 116. The reset transistor 113 resets the electrical potential of the FD unit 116 by applying the reset pulse φRST to the gate before transfer of the signal charge from the photodiode 111 to the FD unit 116.

The drain and source of the selection transistor 115 are respectively connected to the power supply VDD and the drain of the amplification transistor 114. The selection transistor 115 shifts to an on-state through application of a selection pulse φSEL to the gate, and selects the pixel 21B by supplying the power supply VDD to the amplification transistor 114.

Note that a configuration is also possible in which the selection transistor 115 is connected between the source of the amplification transistor 114 and the vertical signal line 121.

The amplification transistor 114 has a source follower configuration in which the gate, the drain, and the source are respectively connected to the FD unit 116, the source of the selection transistor 115, and the vertical signal line 121. The amplification transistor 114 outputs the electrical potential of the FD unit 116 after reset by the reset transistor 113 as the reset level to the vertical signal line 121. Further, the amplification transistor 114 outputs the electrical potential of the FD unit 116 after the transfer of the signal charge by the transfer transistor 112 as the signal level to the vertical signal line 121.

[On Polarity]

Although the n-type MOS transistors have been described as the examples in the embodiments described above, a p-type MOS transistor may be used instead of the n-type MOS transistor.

Note that when manufacturing a p-type MOS transistor, ion species used for implantation should have opposite characteristics.

[On Application]

Although the solid-state imaging devices have been described as the examples in the embodiments described above, applications of the present invention are not limited to the solid-state imaging devices. Applications are possible to semiconductor devices in general.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device comprising:
    forming a gate electrode of a transistor on an insulator layer on a surface of a semiconductor substrate;
    forming an isolation region by performing ion implantation of an impurity of a first conductivity type into the semiconductor substrate;
    forming a lightly doped drain region by performing, after forming a mask pattern including an opening portion narrower than a width of the gate electrode on an upper layer of the gate electrode of the transistor, ion implantation of an impurity of a second conductivity type near the surface of the semiconductor substrate with the mask pattern as a mask; and
    forming a source region and a drain region of the transistor by performing ion implantation of an impurity of the second conductivity type into the semiconductor substrate after forming the gate electrode of the transistor.

2. The method of manufacturing a semiconductor device according to claim 1, wherein the isolation region is formed after the gate electrode of the transistor is formed.

3. The method of manufacturing a semiconductor device according to claim 1 or 2, wherein the ion implantation of the impurity of the second conductivity type is performed in a state where the isolation region is covered with the mask when the lightly doped drain region is formed.

4. A semiconductor device comprising:
    an isolation region which is an impurity region of a first conductivity type;
    a source region and a drain region of a transistor which are impurity regions of a second conductivity type;
    a gate electrode of the transistor which is provided on an insulator layer on a surface of a semiconductor substrate formed with the isolation region and the source region and the drain region of the transistor; and
    a lightly doped drain region of the second conductivity type which is provided near the surface of the semiconductor substrate in a region narrower than a width of the gate electrode of the transistor.

5. The semiconductor device according to claim 4, wherein a width of the lightly doped drain region is approximately equivalent to a width of the source region and the drain region of the transistor or narrower than the width of the source region and the drain region of the transistor.

* * * * *